(12) United States Patent
Lenssen

(10) Patent No.: US 7,411,814 B2
(45) Date of Patent: Aug. 12, 2008

(54) PROGRAMMABLE MAGNETIC MEMORY DEVICE FP-MRAM

(75) Inventor: Kars-Michiel Hubert Lenssen, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 10/529,684

(22) PCT Filed: Sep. 30, 2003

(86) PCT No.: PCT/IB03/04376

§ 371 (c)(1),
(2), (4) Date: Nov. 20, 2006

(87) PCT Pub. No.: WO2004/032146

PCT Pub. Date: Apr. 15, 2004

(65) Prior Publication Data

US 2007/0081381 A1    Apr. 12, 2007

(30) Foreign Application Priority Data

Oct. 3, 2002    (EP) .................................. 02079081

(51) Int. Cl.
*G11C 11/15* (2006.01)
(52) U.S. Cl. ...................................... 365/158; 365/173
(58) Field of Classification Search .................. 365/32, 365/66
See application file for complete search history.

(56) References Cited

U.S. PATENT DOCUMENTS

| | | | | |
|---|---|---|---|---|
| 5,185,716 A | * | 2/1993 | Mehdipour | 365/10 |
| 5,237,529 A | * | 8/1993 | Spitzer | 365/158 |
| 6,163,477 A | * | 12/2000 | Tran | 365/173 |
| 2001/0019461 A1 | * | 9/2001 | Allenspach et al. | 360/59 |

* cited by examiner

Primary Examiner—Tan T. Nguyen
(74) Attorney, Agent, or Firm—Michael E. Belk

(57) ABSTRACT

A memory device has an information plane (32) for storing data bits in a magnetic state of an electro-magnetic material at an array of bit locations (31). The device further has an array of electro-magnetic sensor elements (51) that are aligned with the bit locations. The information plane (32) is programmable or programmed via a separate magnetic writing device (21). In particular a read-only sensor element (60) is described for a read-only magnetic memory.

18 Claims, 3 Drawing Sheets

PROGRAMMABLE MAGNETIC MEMORY DEVICE FP-MRAM

Figure 1A:
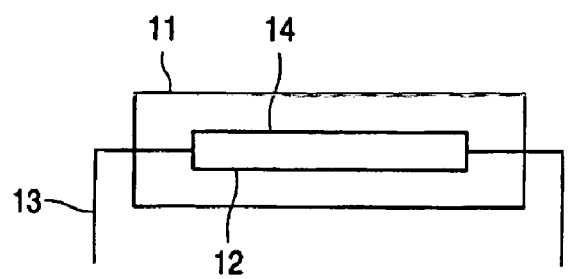

The invention relates to a memory device comprising an information plane comprising an electromagnetic material constituting an array of bit locations, a magnetic state of said material at a bit location representing the value thereof, and an array of electro-magnetic sensor elements that are aligned with the bit locations, The invention further relates to a writing device for programming a memory device.

The invention further relates to a method of manufacturing a memory device.

A magnetic random access memory (MRAM) is known from the article: "*A 256 kb 3.0V 1T1MTJ Nonvolatile Magnetoresistive RAM* by Peter K. Naji et al, as published for the 2001 IEEE International Solid-State Circuits Conference 0-7803-76608-5, ISSCC2001/Session 7/Technology directions: Advanced Technologies/7.6". The MRAM device has a free magnetic layer for information storage. In the device an array of bit cells is accommodated, the bits cells having an electronic sensor element and a bit location on the free magnetic layer. The magnetic state of the material of the free magnetic layer represents the value of the bit location.

In a read mode the sensor element is arranged for detecting the magnetic state, in particular via a tunneling magneto-resistive effect (TMR). Current is guided via a tunneling barrier wherein the tunnel probability is influenced by the magnetic state, resulting in a change of the resistance of the sensor element. In a program (or write) mode a strong program current is guided via a programming circuit and causes a magnetic field strong enough to set the magnetic state at the respective bit location to a predefined value in dependence on the program current. It is to be noted that such a MRAM is of a non-volatile type, i.e. the value of the bit locations do not change if the device is with or without operating power. Hence the MRAM device is suitable for devices that need to be active shortly after power-on. A problem of the known device is that the value of the bit locations has to be programmed by applying the program current for each individual bit cell.

Therefore it is an object of the invention to provide a storage system that has an efficient way of programming the value of the bit locations.

According to a first aspect of the invention the object is achieved with a storage device as defined in the opening paragraph, characterized in that the information plane is programmable or programmed via a separate magnetic writing device.

According to a second aspect of the invention the object is achieved with a writing device as defined in the opening paragraph, characterized in that the device comprises a programming surface for cooperating with the information plane of the memory device, and means for generating a magnetic field at the programming surface for magnetizing the electromagnetic material at the bit locations.

According to a third aspect of the invention the object is achieved with method of manufacturing a memory device as defined in the opening paragraph, characterized in that the method comprises a step of magnetizing the electromagnetic material at the bit locations according to predefined data before encapsulating the device.

The effect of programming the magnetic state of the material at the bit locations using an external writing device is that for a user the contents of the device are immediately available. The memory device can also be used for distributing software content which is programmed during manufacture. This has the advantage that data can be accessed immediately. Further there is a protection against copying the content in a similar storage device, because the user may not have access to a writing device.

The invention is also based on the following recognition. The known magnetic storage device is a solid state device that contains magnetic material in the bit cells that is set to a magnetic state for storing data bits. The isolated patches of material are situated at a specific depth level with respect to the top (or bottom) surface of a substrate (called die) on which the device is formed. The inventors have seen that the combined patches of material can be considered to constitute a single information plane. In the known solid state device the information plane is not accessible, and programming necessarily has to be performed by the bit cell sensor element itself By providing access to the information plane, the material at the bit locations may be set to a defined magnetic state by an external magnetic field from a writing device. An electromagnetic element on a programming surface of the writing device can generate a field extending over a working distance, which is in practice in the same order of magnitude as the minimum dimensions of the bit location. Alignment is required to bring the interface surface of the writing device opposite and close to the bit locations within the working distance. For example, the external writing may be applied during manufacture of the die (when the material constituting the information plane is not yet covered) or after finishing the die and before encapsulation in a housing. Alternatively the external writing is made possible by a special housing for the device that allows close contact between the writing device and the information plane.

In an embodiment of the device the electromagnetic sensor elements comprise read-only sensor elements that are sensitive to, but unable to change, said magnetic state of the electromagnetic material. This has the advantage that the user cannot accidentally or on purpose change the contents of the device. Further such a device can be cheaper and/or of a higher bit density, because the writing circuitry which needs relatively large currents and write components within the sensor element can be left out. In addition the amplitude of the magnetic field used for programming is not limited by a maximum current through thin on-chip metal lines; this allows the use of more stable magnetic materials and elements. This means, for example, that such a memory device can be used in environments with strong external magnetic fields.

It is noted that in U.S. Pat. No. 6,324,093 a write-once thin-film memory is described based on intentionally burning certain spin-tunnel junctions in an MRAM. The burning of junctions does not provide an efficient way of programming a memory device, and does not allow re-programming at al.

Further preferred embodiments of the device according to the invention are given in the dependent claims.

Figure 1B:
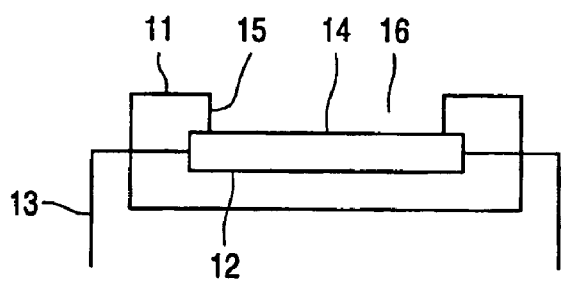
Figure 1C:
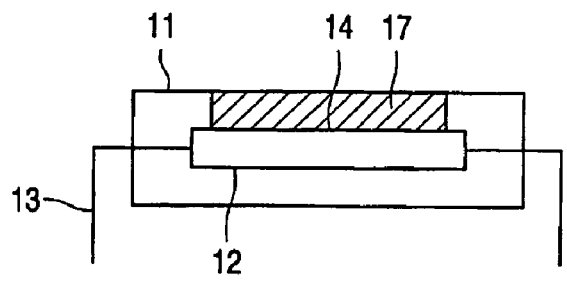
Figure 2:
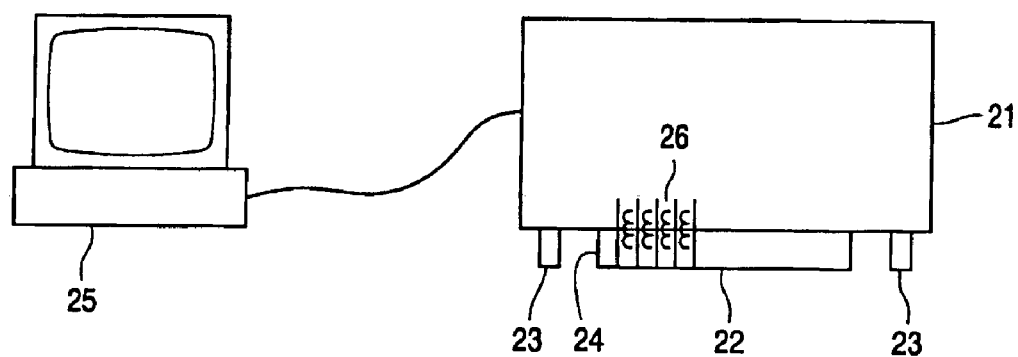
Figure 3:
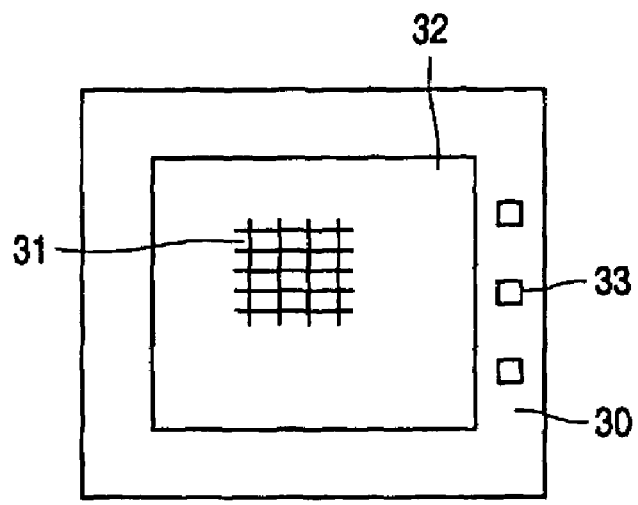
Figure 4:
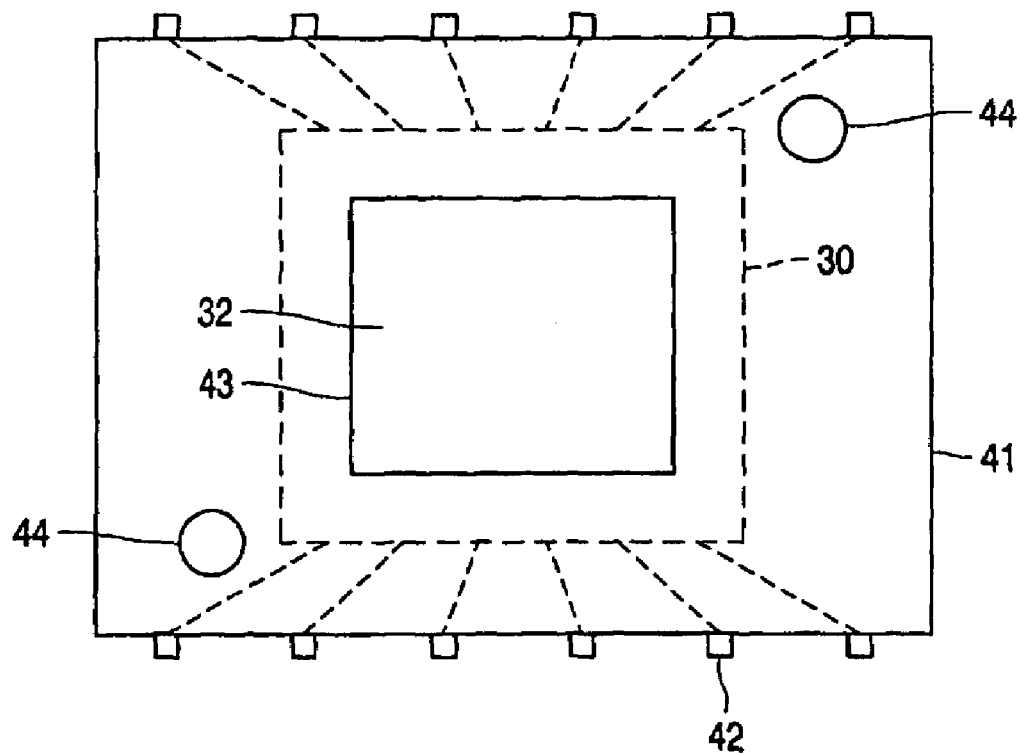
Figure 5:
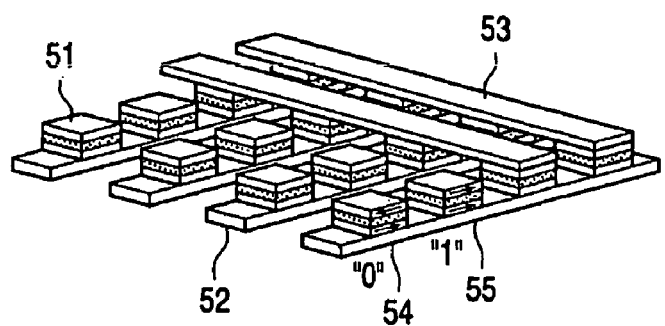
Figure 6:
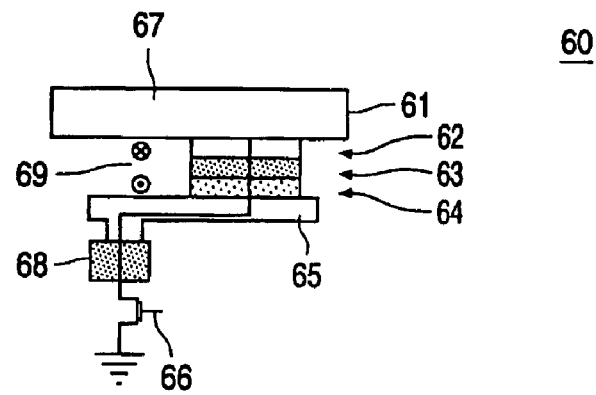
Figure 7:
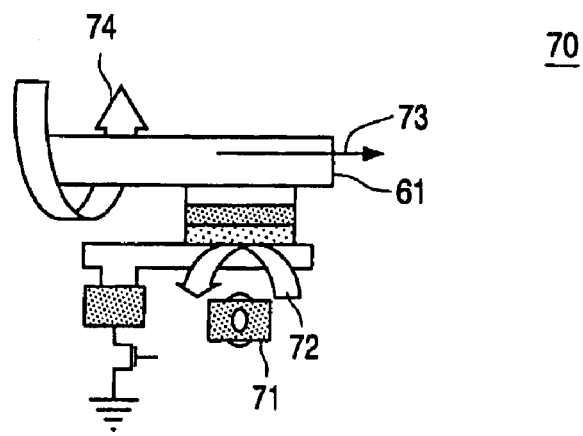

These and other aspects of the invention will be apparent from and elucidated further with reference to the embodiments described by way of example in the following description and with reference to the accompanying drawings, in which FIG. 1*a* shows a programmed storage device, FIG. 1*b* shows a programmable storage device having an interface surface, FIG. 1*c* shows a programmable storage device having a protective cover, FIG. 2 shows a writing device for programming a storage device, FIG. 3 shows a storage device (top view), FIG. 4 shows an encapsulated storage device, FIG. 5 shows an array of sensor elements, FIG. 6 shows a read-only sensor element in detail, and FIG. 7 shows a read/write element in write mode.

In the Figures, elements which correspond to elements already described have the same reference numerals.

FIG. 1*a* shows a programmed storage device. The device has a housing 11 containing a memory device 12. The memory device 12 has an array of bit cells for storing data bits in a corresponding array of bit locations. An electromagnetic material is present at the bit locations. The magnetic state of said material at a bit location represents the logical value thereof. The array of bit locations constitutes an information plane 14. Each bit cell has an electromagnetic sensor element operating on said material at the corresponding bit location, e.g. a read-only cell as described below with FIG. 6 or a read-write cell as described below with FIG. 7. The sensor elements and further electronic circuitry are made on a substrate material forming a so-called die by techniques well known from semiconductor manufacture, such as MRAM chips. The die is provided with electrical connections to leads 13 that provide coupling to any electrical circuit outside the housing. The information bits are represented by magnetized states of the material in the bit cells, for example the free layers in the spin-tunnel junctions, similar to normal MRAM. This enables to make a factory-programmable read-only memory that is fully MRAM-compatible.

The programming of the memory has been done by applying external magnetic fields, e.g. at the end of the IC-production. The information plane 14 is programmed via a separate magnetic writing device before encapsulating the memory device 12 in the housing 11. Thereto the die (at an intermediate state of its production) is positioned at a programming interface of a separate magnetic writing device. The programming interface has an array of field generators that generate a specific magnetic field at each bit location in the information plane. The field is strong enough to set the magnetic state of the material at the bit location to a specific value. The positioning includes aligning the magnetic field generators opposite the bit cells of the memory device. In an embodiment of the programming step during manufacture the positing is controlled by reading a signal from bit cells of the memory device, for example by verifying the signal against the data to be programmed.

FIG. 1*b* shows a programmable storage device having an interface surface. The device has a housing 11 containing a memory device 12, which housing generally corresponds to the housing described with FIG. 1*a*. In the embodiment shown in FIG. 1*b* the housing 11 is provided with an opening 16 for receiving an external programming device. The opening has precisely shaped side walls 15 acting as mechanical alignment for positioning a programming surface of the programming device over the information plane 14, and achieving a one to one alignment of the bit locations and the field generator elements in the programming surface. The information plane is exposed to the outside world. In an embodiment the information plane is covered by a protective layer or by a removable cover part (not shown) that fits into the opening 16 when programming is not required.

FIG. 1*c* shows a programmable storage device having a protective cover. The device has a housing 11 containing a memory device 12 and generally corresponds to the device described with FIG. 1*a*. In the embodiment shown in FIG. 1*c* the housing 11 is provided with a fixed protective cover 17 for preventing any programming or changing said magnetic state at the bit locations via a magnetic field. In an embodiment the protective cover 17 is provided with a magnetically shielding material for effectively shielding the information plane. It is noted that the protective cover can be put in position during initial encapsulation, of course after programming the device as described with reference to FIG. 1*a*. Alternatively the housing as shown in FIG. 1*b* having an opening is used, and the opening is closed later, e.g. after the device has been mounted on a printed circuit board and has been programmed by an equipment manufacturer.

FIG. 2 shows a writing device for programming a storage device. A programming unit 21 has a programming surface 22 for cooperating with the information plane of the memory device. The programming unit may be stand alone or may be coupled to a programming system 25, for example a computer running suitable programming software. An array of magnetic field generators is placed immediately behind the programming surface 22. Each field generator 26 generates a magnetic field at the programming surface for magnetizing the electromagnetic material at the corresponding bit location opposite that generator. The programming surface 22 is positioned on protruding portion having precisely shaped walls 24 for acting as mechanical alignment for positioning the programming surface 22 over an information plane 14 of a device to be programmed. The aligning is required to achieve a one to one alignment of the bit locations and the field generator elements in the programming surface. In an embodiment the programming unit has alignment pins 23 for cooperating with precisely shaped holes in a memory device.

It is noted that various other alignment means can be easily designed, for example an active alignment using a few small actuators for moving the memory device with respect to the programming surface until an optimal aligning has been achieved. In an embodiment misalignment is detected by providing electronic means to recognize the location of the memory device with respect to the writer. This can be done by pattern recognition and matching with a known pattern. In an embodiment the alignment is measured by a signal derived from the sensor elements in the memory device, or by a special sensor element outside the array that is adapted to detect an alignment magnetic field generated by the programming device on a predefined location with respect to the programming surface. Alternatively optical marks are provided on the memory device and are detected by optical sensors in the writing device.

Further embodiments of the programming device are as follows. The writing device contains a multitude of programming surfaces for programming a wafer of dies in a single programming step. The programming device could has a magnetic field source in combination with a specifically designed magnetic shield, i.e. a pattern of holes correlating with the bit locations that should be written. In particular two different shields should be used subsequently with opposite magnetic fields (e.g. first write all 0's, then all 1's). In a first step all bit location could be reset (e.g. all 0's written) by a strong homogeneous magnetic field and subsequently only the bits at specific locations where 1's are desired are reversed. In a further embodiment a homogenous field could be applied that is not sufficiently strong to reverse bits at room temperature; then the bits to written are locally heated, e.g. by short current pulses through or near the bits, or by exposure to a heat source via a mask. In a first step 0's are written, then the process is repeated with an opposite field direction for the 1's. Alternatively first all bits are reset by a strong field, a specific bits are programmed.

In an embodiment of the magnetic writing device the field generators are constituted by a magnetic head (or an array of magnetic write heads) and a scanning unit for scanning the programming surface. Data is programmed at the bit locations serially via the head(s). Such a programming device is suitable for programming a limited number of bit locations, e.g. for writing a serial number or a unique encryption key in a memory device.

Further the programming equipment could consist of an array of small permanent magnets used as a "magnetic stamp" to program the memory, or an array of electromagnets instead of permanent magnets. In an embodiment of the magnetic writing device the field generators are constituted by permanent magnetic material that has a magnetic state according to the data to be programmed.

FIG. 3 shows a storage device (top view). A memory device 30 is constituted by a die containing electronic circuitry and an array 31 of bit cells. The device 30 is intended to cooperate with the writing device described above. Thereto the device has an interface surface 32 that accommodates the array 31. The array is a two-dimensional layout of electromagnetic sensor units including a magnetic material constituting the information plane. Further the die is provided with bonding pads 33 for connecting to the external world, e.g. via wires and leads.

FIG. 4 shows an encapsulated storage device. The memory device 30 is encapsulated in a housing 41. External leads 42 are provided for connecting the device to electronic circuits on a printed circuit board. The external leads 42 are connected via wires to bonding pads on the memory device 30 (shown in dashed lines). The storage device has an opening 43 exposing the interface surface 32 of the memory device 30 for cooperating with a programming device as described above. Further the housing has precisely shaped holes 44 for cooperating with guiding pins of the programming device.

FIG. 5 shows an array of sensor elements. The array has sensor elements 51 in a regular pattern of rows. The elements of a row are coupled by shared bit lines 53, while in columns the elements share word lines 52. Each sensor element shown has a multilayer stack. A sensor element 54 is shown having opposite magnetic states in layers of the multilayer stack for representing the configuration when measuring a bit location with a logic value 0. A sensor element 55 is shown having equal magnetic states in layers of the multilayer stack for representing the configuration when measuring a bit location with a logic value 1. The direction is detected in sensor elements having a multilayer or single layer stack by using a magneto-resistive effect, for example GMR, AMR or TMR. The TMR type sensor is preferred for resistance matching reasons for the sensor element. While the given examples use magnetoresistive elements with in-plane sensitivity it is also possible to use elements that are sensitive to perpendicular fields. For a description of sensors using these effects refer to "Magnetoresistive sensors and memory" by K.-M. H. Lenssen, as published in "Frontiers of Multifunctional Nanosystems", page 431-452, ISBN 1-4020-0560-1 (HB) or 1-4020-0561-X (PB).

In the array sensor elements may be read-only elements as described with FIG. 6 for constituting a read-only memory. This has the advantage that no electronic circuitry is needed for generating write currents. Alternatively the sensor elements may be read-write elements, such as MRAM elements described with FIG. 7. This has the advantage that the user may later change the values of the bit locations. In an embodiment the array has a combination of read-only and read-write elements. This has the advantage that specific data in the memory cannot be changed accidentally.

In the read-only type sensor element the read-out is done by a resistance measurement which relies on a magnetoresistance (MR) phenomenon detected in a multilayer stack. Sensor elements can be based on the anisotropic magnetoresistance (AMR) effect in thin films. Since the amplitude of the AMR effect in thin films is typically less than 3%, the use of AMR requires sensitive electronics. The larger giant magnetoresistance effect (GMR) has a larger MR effect (5 à15%), and therefore a higher output signal. The magnetic tunnel junctions use a large tunnel magnetoresistance (TMR) effect, and resistance changes up to ≈50% have been shown. Because of the strong dependence of the TMR effect on the bias voltage, the useable resistance change in practical applications is at present around 35%. In general, both GMR and TMR result in a low resistance if the magnetization directions in the multilayer stack are parallel and in a high resistance when the magnetizations are oriented antiparallel. In TMR multilayers the sense current has to be applied perpendicular to the layer planes (CPP) because the electrons have to tunnel through the barrier layer; in GMR devices the sense current usually flows in the plane of the layers (CIP), although a CPP configuration might provide a larger MR effect, but the resistance perpendicular to the planes of these all-metallic multilayers is very small. Nevertheless, using further miniaturization, sensors based on CPP and GMR are possible.

FIG. 6 shows a read-only sensor element in detail. The read-only sensor element (60) is of the read-only type that is able to read, but not to alter, the value of a bit cell. The element has a bit line 61 of an electrically conductive material for guiding a read current 67 to a multilayer stack of layers of a free magnetic layer 62, a tunneling barrier 63, and a fixed magnetic layer 64. The stack is build on a further conductor 65 connected via a selection line 68 to a selection transistor 66. The selection transistor 66 couples said read current 67 to ground level for reading the respective bit cell when activated by a control voltage on its gate. The magnetization directions 69 present in the fixed magnetic layer 64 and the free magnetic layer 62 determine the resistance in the tunneling barrier 63, similar to the bit cell elements in an MRAM memory. The magnetization in the free magnetic layer is determined during programming by the external magnetic writing device.

In an embodiment a number of sensor elements are read at the same time. The addressing of the bit cells is done by means of an array of crossing lines. The read-out method depends on the type of sensor. In the case of pseudo-spin valves a number of cells (N) can be connected in series in the word line, because the resistance of these completely metallic cells is relatively low. This provides the interesting advantage that only one switching element (usually a transistor) is needed per N cells. The associated disadvantage is that the relative resistance change is divided by N. The read-out is done by measuring the resistance of a word line (with the series of cells), while subsequently a small positive plus negative current pulse is applied to the desired bit line. The accompanying magnetic field pulses are between the switching fields of the two ferromagnetic layers; thus the layer with the higher switching field (the sensing layer) will remain unchanged, while the magnetization of the other layer will be set in a defined direction and then be reversed. From the sign of the resulting resistance change in the word line it can be seen whether a '0' or a '1' is stored in the cell at the crossing point the word and the bit line. In an embodiment spin valves with a fixed magnetization direction are used and the data is detected in the other, free magnetic layer. In this case the absolute resistance of the cell is measured. In an embodiment the resistance is measured differentially with respect to a reference cell. This cell is selected by means of a switching element (usually a transistor), which implies that in this case one transistor is required per cell. Besides sensors with one transistor per cell, alternatively sensors without transistors within the cell are considered. The zero-transistor per cell sensor elements in cross-point geometry provide a higher density, but have a somewhat longer read time.

FIG. 7 shows a read/write element in write mode. The read-write element (70) has the same components as the read-only element (60) described above with reference to FIG. 6, and in addition a write line 71 for conducting a relatively large write current for generating a first write field component 72. Via bit line 61 a second write current 73 is guided for generating a second write field component 74. The combined field generated by both write currents is strong enough to set the magnetic state in the free magnetic layer 62. Writing a certain cell is equivalent to setting a magnetization in the desired direction, for example, magnetization to the left means '0' and magnetization to the right means '1'. By applying a current pulse to a bit line and a word line a magnetic field pulse is induced. Only the cell in the array at the crossing point of both lines experiences the maximum magnetic field (i.e. the vectorial addition of the fields induced by both current pulses) and its magnetization is reversed; all other cells below the bit or word line are exposed to the lower field that is caused by a single current pulse and will therefore not change their magnetization directions.

For the representation of the bits there exist different possibilities. So-called pseudo-spin valves comprise two ferromagnetic layers that switch their magnetization direction at different magnetic fields; this can be accomplished by using layers of different magnetic materials, or layers of the same material but of different thickness. In another embodiment exchange-biased spin-tunnel junctions are used, wherein the magnetization direction of one of the magnetic layers is so rigid that it can be considered fixed under normal operation conditions. This can, for example, be achieved by using exchange biasing or an artificial antiferromagnet.

The memory device according to the invention is in particular suitable for the following applications. The read-only type can be used instead of mask-ROM that would require its contents already in the mask design. This has the advantage that the content can be programmed "in the last moment of the production". Further types of One-Time-Programmable memory can also be replaced, with the advantage that the new device can be programmed more than once (so that already programmed memories can be updated or corrected and do not become outdated). A further application is a portable device that needs exchangeable memory, e.g. a laptop computer or portable music player. The storage device has low power consumption, and instant access to the data. The device can also be used as a storage medium for content distribution. A further application is a smartcard. Also the device can be applied as secure memory that cannot be rewritten after the production, e.g. as a memory that has to store data that are unique for every individual IC (e.g. a unique identification number or a counter or a random secret code etc.).

In an embodiment the device has read-write elements in a part of the device in combination with a read-only part. The read-only array part of the memory device is applied as memory that contains an operating system, program code, etc. A further application is a memory that is very well copyright-protected. For example this type of memory is suitable for game distribution. In contrast to existing solutions it has all the following properties:

easily replicable, copy-protected, instant-on, fast access time, robust, no moving parts, low power consumption, etc.

Although the invention has been mainly explained by embodiments using the TMR effect, any suitable read/write element for cooperating with the magnetic material can be used, e.g. based on coils. It is noted, that in this document the verb 'comprise' and its conjugations do not exclude the presence of other elements or steps than those listed and the word 'a' or 'an' preceding an element does not exclude the presence of a plurality of such elements, that any reference signs do not limit the scope of the claims, that the invention may be implemented by means of both hardware and software, and that several 'means' or 'units' may be represented by the same item of hardware or software. Further, the scope of the invention is not limited to the embodiments, and the invention lies in each and every novel feature or combination of features described above.

The invention claimed is:

1. A memory device comprising:
an array of bit cells for storing data bits in a corresponding array of bit locations, the array of bit cells constituting an information plane wherein each of said bit locations includes an electromagnetic material, wherein a magnetic state of said electromagnetic material at said bit locations represents the logical value thereof, and
an array of electro-magnetic sensor elements that are aligned with the bit locations,
wherein the information plane comprising said array of bit cells is programmable or programmed via a magnetic field induced via a separate magnetic writing device.

2. A device as claimed in claim 1, wherein the array of electromagnetic sensor elements comprise read-only magnetic sensor elements that are sensitive to, but unable to change, said magnetic state of the electromagnetic material.

3. A device as claimed in claim 1, wherein the device further comprising a housing for encapsulating the array of electromagnetic sensor elements, which housing has an interface surface for cooperating with a programming surface of the writing device for receiving said magnetic field for magnetizing the electromagnetic material at the bit locations.

4. A device as claimed in claim 1, wherein the device further comprising a housing for encapsulating the array of electromagnetic sensor elements, which housing has a protective cover for preventing selectively changing said magnetic state at the bit locations via said magnetic field.

5. A device as claimed in claim 4, wherein the protective cover comprises a magnetic shielding material.

6. A device as claimed in claims 1, wherein the electromagnetic sensor elements comprise read-write elements that are aligned with further bit locations of said information plane, which read-write elements are sensitive to, and also able to change, said magnetic state of the electro-magnetic material.

7. A device as claimed in claim 6, wherein the read-only sensor elements and the read-write elements are arranged in a single array.

8. A writing device for programming a memory device as claimed in claim 1, wherein the writing device comprises:
a programming surface for cooperating with the information plane of the memory device, and
means for generating a magnetic field via controllable radiation beams at the programming surface for magnetizing the electromagnetic material at each bit location of the array of bit locations of the information plane.

9. A writing device as claimed in claim 8, wherein the programming surface is arranged for cooperating with interface surface of a housing of the memory device.

10. A writing device as claimed in claim 8, wherein the means for generating a magnetic field comprise at least one of: an array of individually controllable write elements an array of permanent magnetic elements; a magnetic head; scanning means for scanning the information plane at the programming surface via a magnetic head.

11. A device as claimed in claim 1, wherein said device is fully M-RAM compatible.

12. A method of manufacturing a memory device, the method comprising:

constructing an information plane comprised of an array of bit cells at predefined bit locations, wherein each bit cell is programmable or programmed via a magnetic field induced via a separate magnetic writing device;

providing a predetermined amount of magnetic material at each bit cell;

constructing an array of electro-magnetic sensor elements that are aligned with the bit locations of the array of bit cells, programming the information plane via said separate writing device via magnetization of the electromagnetic material at the bit locations of the information plane; and providing the memory device in a housing, said housing providing a protective cover for preventing selectively changing said magnetic state at the bit locations via said magnetic field.

13. A method of manufacturing a memory device as claimed in claim 12, wherein the protective cover comprises a magnetic shielding material.

14. A method of manufacturing a memory device as claimed in claim 12, wherein the protective cover comprises a magnetic shielding material.

15. A method of manufacturing a memory device as claimed in claim 12, wherein the array of electromagnetic sensor elements comprise read-only magnetic sensor elements that are sensitive to, but unable to change, said magnetic state of the electromagnetic material.

16. A method of manufacturing a memory device as claimed in claim 12, wherein the electromagnetic sensor elements comprise read-write elements that are aligned with further bit locations of said information plane, which read-write elements are sensitive to, and also able to change, said magnetic state of the electro-magnetic material.

17. A method of programming a memory device using an external writing device, the method comprising:

aligning a programming surface of said external writing device over an information plane of said memory device to be programmed to achieve a one to one alignment of bit locations of the information plane and field generator elements of said external writing device; and generating, via the field generator elements, a magnetic field at the bit locations to magnetize the electromagnetic material at the bit locations of the memory device according to predefined data.

18. A method of programming a memory device as claimed in claim 17, wherein said alignment is performed via one of: active alignment utilizing one or more actuators, optical sensing via optical markers provided on said memory device.

* * * * *